US012512823B2

(12) United States Patent
Finn et al.

(10) Patent No.: US 12,512,823 B2
(45) Date of Patent: Dec. 30, 2025

(54) MULTI-REGION TRANSMITTER OUTPUT WAVEFORM CONTROL

(71) Applicant: Renesas Electronics America Inc., Milpitas, CA (US)

(72) Inventors: Steven Ernest Finn, Atlanta, GA (US); Chan Youn Won, Suwanee, GA (US); Suresh Atluri, Allen, TX (US)

(73) Assignee: Renesas Electronics America Inc., Milpitas, CA (US)

( * ) Notice: Subject to any disclaimer, the term of this patent is extended or adjusted under 35 U.S.C. 154(b) by 84 days.

(21) Appl. No.: 18/463,717

(22) Filed: Sep. 8, 2023

(65) Prior Publication Data

US 2025/0088182 A1    Mar. 13, 2025

(51) Int. Cl.
*H03K 5/04* (2006.01)
*H03K 17/687* (2006.01)

(52) U.S. Cl.
CPC ............. *H03K 5/04* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 7,598,785 | B2* | 10/2009 | Im | G11C 29/02 327/170 |
| 7,626,423 | B1* | 12/2009 | Li | H03K 19/018585 326/38 |
| 8,169,209 | B2* | 5/2012 | Chen | H03F 3/217 323/283 |
| 8,305,053 | B2* | 11/2012 | Truong | H02M 3/158 327/170 |
| 8,861,287 | B2* | 10/2014 | Shimizu | G11C 7/1057 365/185.05 |
| 9,236,866 | B2* | 1/2016 | Youn | H02M 3/158 |
| 9,312,852 | B2* | 4/2016 | De Geeter | H03K 17/166 |

* cited by examiner

*Primary Examiner* — Jeffrey S Zweizig
(74) *Attorney, Agent, or Firm* — SCULLY, SCOTT, MURPHY & PRESSER, P.C.

(57) ABSTRACT

Systems and methods for operating a driver circuit are described. In a first region of a transition from an input signal to an output signal, a circuit can control a slew rate of the output signal to a first rate. The first region can terminate prior to the output signal reaching a predefined threshold voltage. In a second region of the transition, the circuit can reduce the slew rate of the output signal to a second rate lower than the first rate. The output signal crosses the predefined threshold voltage in the second region. In a third region of the transition, the circuit can increase the slew rate of the output signal to a third rate greater than the second rate. The transition can complete in the third region. The circuit can output the output signal to drive a transistor in an output drive stage of the driver circuit.

17 Claims, 5 Drawing Sheets

MULTI-REGION TRANSMITTER OUTPUT WAVEFORM CONTROL

BACKGROUND OF THE SPECIFICATION

The present disclosure relates to a data signal driver in a transmitter, and more particularly, relates to waveform control of an output of the transmitter.

A data signal driver, such as a push-pull driver, can output a signal that can control two power transistors, a high-side switch and a low-side switch, to switch a direct current (DC) input voltage in alternate half-cycles in order to generate an output signal. Each power transistor can be responsible for the positive and negative half cycles of a waveform of the output signal. In operation, one power transistor can be turned on at a time. The output signal can supply current to a load (e.g., push) or can sink current from the load (e.g., pull).

SUMMARY

In one embodiment, a semiconductor device is generally described. The semiconductor can include a predriver circuit and a circuit. The predriver circuit can include a complementary metal-oxide semiconductor (CMOS) inverter configured to invert an input signal to generate an output signal. The circuit can be configured to, in a first region of a transition from the input signal to the output signal, control a slew rate of the output signal to a first rate. The first region can terminate prior to the output signal reaching a predefined threshold voltage. The circuit can be further configured to, in a second region of the transition from the input signal to the output signal, reduce the slew rate of the output signal to a second rate lower than the first rate. The output signal can cross the predefined threshold voltage in the second region. The circuit can be further configured to, in a third region of the transition from the input signal to the output signal, increase the slew rate of the output signal to a third rate greater than the second rate, wherein the transition is completed in the third region. The circuit can be further configured to output the output signal to drive a transistor in an output drive stage of a driver circuit.

In one embodiment, an apparatus is generally described. The apparatus can include a controller, an output driver stage and a circuit. The controller can be configured to provide an input signal. The output driver stage can include a high-side transistor and a low-side transistor. The output driver stage can be configured to use a pair of drive signals to drive the high-side transistor and the low-side transistor. The circuit can be configured to control slew rates of the pair of drive signals. The slew rates can be controlled to have different rates in different regions of transitions from the input signal to the pair of drive signals. A crowbar current in the output driver stage can be dependent on the different rates in the different regions of the transitions.

In one embodiment, a method for operating a driver circuit is generally described. The method can include, in a first region of a transition from an input signal to an output signal, controlling a slew rate of the output signal to a first rate. The first region can terminate prior to the output signal reaching a predefined threshold voltage. The method can further include, in a second region of the transition from the input signal to the output signal, reducing the slew rate of the output signal to a second rate lower than the first rate. The output signal can cross the predefined threshold voltage in the second region. The method can further include, in a third region of the transition from the input signal to the output signal, increasing the slew rate of the output signal to a third rate greater than the second rate. The transition can be completed in the third region. The method can further include using the output signal to drive a transistor in an output drive stage of a driver circuit.

The foregoing summary is illustrative only and is not intended to be in any way limiting. In addition to the illustrative aspects, embodiments, and features described above, further aspects, embodiments, and features will become apparent by reference to the drawings and the following detailed description. In the drawings, like reference numbers indicate identical or functionally similar elements.

DETAILED DESCRIPTION

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1:
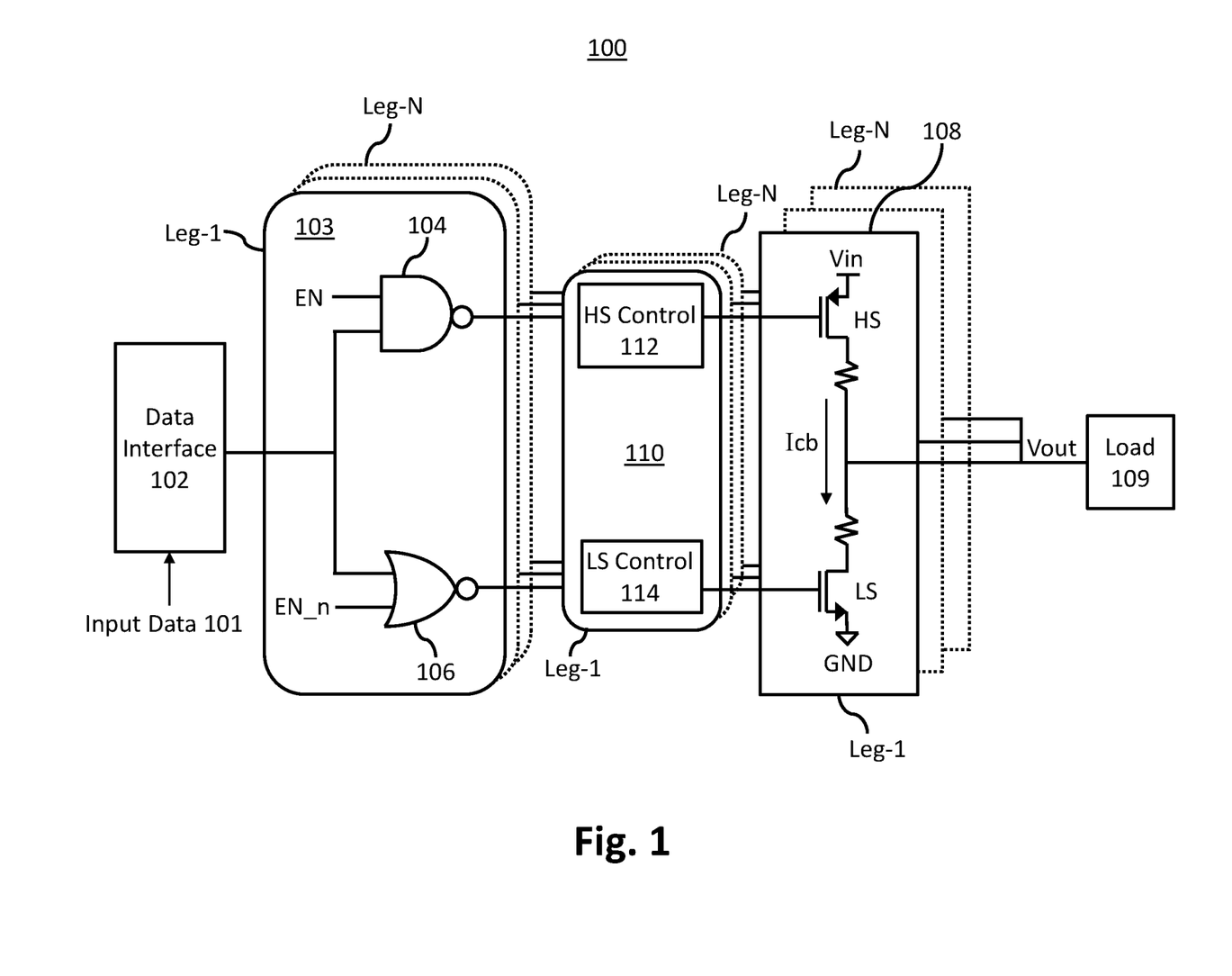
FIG. 1 is a diagram showing an apparatus that can implement multi-region transmitter output waveform control in one embodiment.

FIG. 1 is a diagram showing an apparatus that can implement skew corner driver compensation in one embodiment. An apparatus shown in FIG. 1 can be a semiconductor device implementing a driver circuit 100. In one embodiment, driver circuit 100 can be a multi-leg push-pull data driver. Driver circuit 100 can include multiple legs, such as N legs ranging from Leg-1 to Leg-N. A leg can be a section that can be configured to perform a particular task. For example, one leg can provide data and commands (e.g., in the form of voltages) to control one load of a device and another leg can provide data and commands to control another load of the device.

Using Leg-1 as example, each leg can include at least a data interface 102, a controller 103, a waveform control circuit 110 and an output driver stage 108. Controller 103 can be, for example, a microcontroller including various types of hardware and circuit elements such as logic gates and other application-specific circuits. In the example shown in FIG. 1, controller 103 can include at least a NAND gate 104 and a NOR gate 106. Output driver stage 108 can include a pair of power transistors including a high-side (HS) transistor and a low-side (LS) transistor. Output driver stage 108 can further include driver circuitry configured to drive HS and LS transistors. HS transistor can be a P-type metal-oxide-semiconductor (PMOS) device such as a P-type metal-oxide-semiconductor field effect transistor (MOSFET). LS transistor can be a N-type metal-oxide-semiconductor (NMOS) device such as a N-type MOSFET.

Data interface 102 can be configured to receive input data 101 intended for load 109. Leg-1 can be configured to provide data to a load 109 in the form of output voltage Vout. Driver circuit 100 can receive input voltage Vin from, for example, a power supply, and output driver stage 108 can switch HS and LS transistors to convert Vin into Vout. NAND gate 104 in controller 103 can receive an enable signal EN to turn on HS transistor and NOR gate 106 in controller 103 can receive an enable signal EN_n to turn on LS transistor. Enable signals EN and EN_n can be complementary such that only one of HS and LS transistors is turned on at a time.

Output driver stage 108 can be configured to drive HS transistor ON and OFF based on an output, or a drive signal, from NAND gate 104. Output driver stage 108 can be configured to drive LS transistor ON and OFF based on an output, or a drive signal, from NOR gate 106. During a push phase, NAND gate 104 can output a low logic voltage level (e.g., representing logic 0) and HS transistor can be activated (e.g., closed) or turned on. Current can flow through the activated HS transistor from Vin to Vout. During push phase, LS transistor remains inactive (e.g., opened) and non-conducting such that no current flows through LS transistor. During a pull phase, NOR gate 106 can output a high logic voltage level (e.g., representing logic one) and LS transistor can be activated (e.g., closed) or turned on. Current can flow through the activated LS transistor from Vout to ground (GND). During pull phase, HS transistor remains inactive (e.g., opened) and non-conducting such that no current flows through HS transistor.

In an aspect, drive signals being used by a push-pull driver can be pull-up signals or pull-down signals. Pull-up signals can drive the output voltage to a high level (e.g., Vin) and pull-down signals can drive the output voltage to a low level (e.g., GND). When a pull-up signal pulls the output voltage from low to high, a rising rate of the output voltage can be referred to as a rising slew rate. When a pull-down signal pulls down the output voltage from high to low, a falling rate of the output voltage can be referred to as a falling slew rate.

In an aspect, crowbar current Ich, which may be also referred to as switching current or transient current, between two transistors such MOSFETs is current that flows during the switching transitions when one of HS and LS transistors turns ON while the other turns OFF. If HS and LS transistors transition (e.g., crossing respective gate threshold voltages) at approximately the same time, there may be a relatively small time instance where both HS and LS transistors are turned on at the same time, which allows crowbar current Icb to flow from Vin to GND. Crowbar current can lead to voltage spikes, ringing, and other undesirable effects at Vout. These effects can also cause stress on the HS and LS transistors and other components in apparatus 100.

To minimize crowbar current while maintaining data integrity at Vout, (e.g., accurate and smooth output waveform). Waveform control circuit 110 can be implemented to provide relatively accurate control of high impedance states at Vout. Each leg of apparatus 100 can include a respective waveform control circuit 110 configured to provide waveform control to shape the waveform of gate voltages being applied to HS and LS transistors. Each waveform control circuit 110 can include a HS control circuit 112 and a LS control circuit 114 configured to control rising and falling slew rates of gate voltages being used for driving HS transistor and LS transistor, respectively. HS control circuit 112 and a LS control circuit 114 can be identical circuits. In one embodiment, waveform control circuit 110 can be configured to control gate voltage change rates in different operation regions of a predriver stage of the HS and LS transistors. The control of different operation regions can shape the waveform of gate voltages being applied to HS and LS transistors. As a result of using waveform control circuit 110 to control the gate voltage waveforms, crowbar current Icb can be reduced and/or minimized while the output voltage Vout waveform can be maintained as an accurate and smooth output waveform. Waveform control circuit 110 can also be implemented for architecture that utilizes multiple legs of push-pull pairs. In one embodiment, a number of parallel legs enable respective waveform control circuit 110 simultaneously to control their respective effective impedance.

Figure 2:
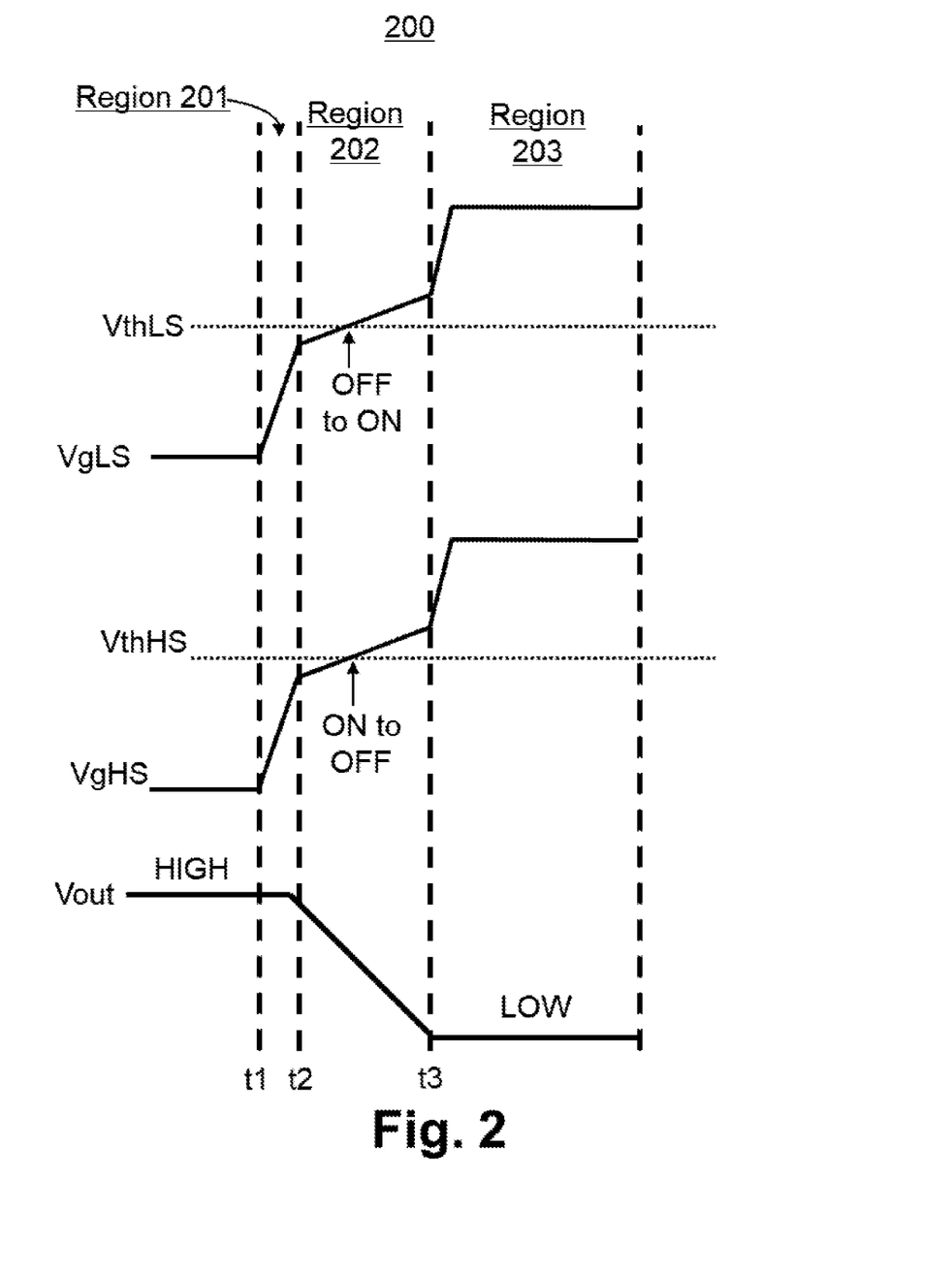
FIG. 2 is a diagram showing waveforms of driver output resulting from an implementation of multi-region transmitter output waveform control in one embodiment.

FIG. 2 is a diagram showing an example waveform control circuit that can be used for implementing multi-region transmitter output waveform control in one embodiment. Descriptions of FIG. 2 may reference components that are also shown in FIG. 1. Example waveforms of gate voltages VgLS and VgHS being applied to gate terminals of LS transistor and HS transistor, respectively, are shown in FIG. 2. Further, an example waveform of Vout corresponding to VgLS and VgHS is also shown in FIG. 2.

Waveform control circuit 110 can control a predriver stage (e.g., prior to drive signal reaching output driver stage 108) that includes multiple operation regions 201, 202, 203. Operation region 201 can be a transition preparation region where LS and HS transistors get ready for a transition from one state to another state, such as a transition from OFF to ON, or a transition from ON to OFF. Operation region 202 can be a transition region where LS and HS transistors are transitioning from one state to another state, such as transitioning from OFF to ON, or from ON to OFF. Operation region 203 can be a reset region where LS and HS transistors get reset to a fully switched condition, and are maintained at a constant voltage level, reflecting that transition into an ON or OFF state is completed.

At a start of operation region 201, such as a time t1, a transition cycle to drive the output voltage Vout from HIGH to LOW is initiated. In order to drive the Vout from HIGH to LOW, the PMOS device or HS transistor needs to be turned OFF and the NMOS device or LS transistor needs to be turned ON. To turn off HS transistor, a gate voltage VgHS driving HS transistor needs to be pulled up to a high voltage or to supply rail (e.g., HS transistor being a PMOS device). To turn on LS transistor, a gate voltage VgLS driving LS transistor needs to be pulled up to a high voltage or to Vin (e.g., LS transistor being a NMOS device). Under operation Region 201, waveform control circuit 110 can change both gate voltages VgLS and VgHS (e.g., increase VgLS and decrease VgHS) under a relatively rapid speed. At a time t2, prior to the gate voltage reaching the threshold voltage for either transistor, the rapid voltage change is terminated. Under operation region 201, Vout can be maintained at HIGH voltage level for at least a portion of time within the time interval t2−t1 (e.g., duration of operation region 201 is t2−t1) since HS and LS transistors may not switch states immediately.

At a start of operation region 202, such as at time t2, waveform control circuit 110 can reduce the gate voltage rate change, or change of VgHS and VgLS, such that VgHS increases at a slower rate and VgLS increases at a slower rate when compared to operation region 201. Under operation region 202, both HS and LS transistors can transition from one state to another in response to reaching their respective threshold voltage VthHS and VthLS. HS transistor can transition from ON to OFF state in operation region 202 and LS transistor can transition from OFF to ON state in operation region 202. As the rate of change to VgLS decreases in region 202, a slew rate to turn on the LS transistor can also be reduced. Also, as the rate of change to VgHS decreases in region 202, a slew rate to turn off the HS transistor can also be reduced. In an aspect, the crowbar current Icb can slow down as long as the slew rate to turn on the LS transistor is less than the slew rate to turn on the HS transistor, and vice versa. Waveform control circuit 110 can be configured to individually control the gate voltage rate change of the HS and LS transistors. The individual control of gate voltage rate change to the HS and LS transistors can cause the slew rate to turn on the LS transistor to be maintained less than the slew rate to turn on the HS transistor, and vice versa. Therefore, waveform control circuit 110 can be configured to slow down the crowbar current Icb flowing through the LS transistor if both HS and LS transistors are turned on simultaneously slow down crowbar current Icb flowing from Vin to GND in potential situations where both HS and LS transistors are turned on.

At a start of operation region 203, such as a time t3, waveform control circuit 110 can increase the rate of change of gate voltages VgHS and VgLS until a desired voltage is reached. Under operation region 203, HS and LS transistors can be at fully-switched conditions reflecting a completion of state transition. Waveform control circuit 110 can be configured to arbitrarily adjust the rate of change of VgHS and VgLS under operation regions 201, 202 and/or 203. Thus, the crowbar current Icb can be controlled by waveform control circuit 110 as well. Waveform control circuit 110 can provide improved control of the transition points of HS and LS transistors, allowing for minimizing crowbar current Icb as well as control over high-impedance states. In the embodiment shown in FIG. 2, waveform control circuit 110 is driving HS and LS transistor symmetrically under operation regions 201 and 202, such that the magnitudes of the rate of change of VgHS and VgLS in operation regions 201 and 202 are the same (e.g., same magnitude but different direction of change). In some embodiments, waveform control circuit 110 can drive HS and LS transistor asymmetrically under operation regions 201 and/or 202, such that the magnitudes of the rate of change of VgHS and VgLS in operation regions 201 and/or 202 can be different. The asymmetric driving of can provide tradeoff between crowbar current and transient impedance depending on an application of system 100.

Figure 3:
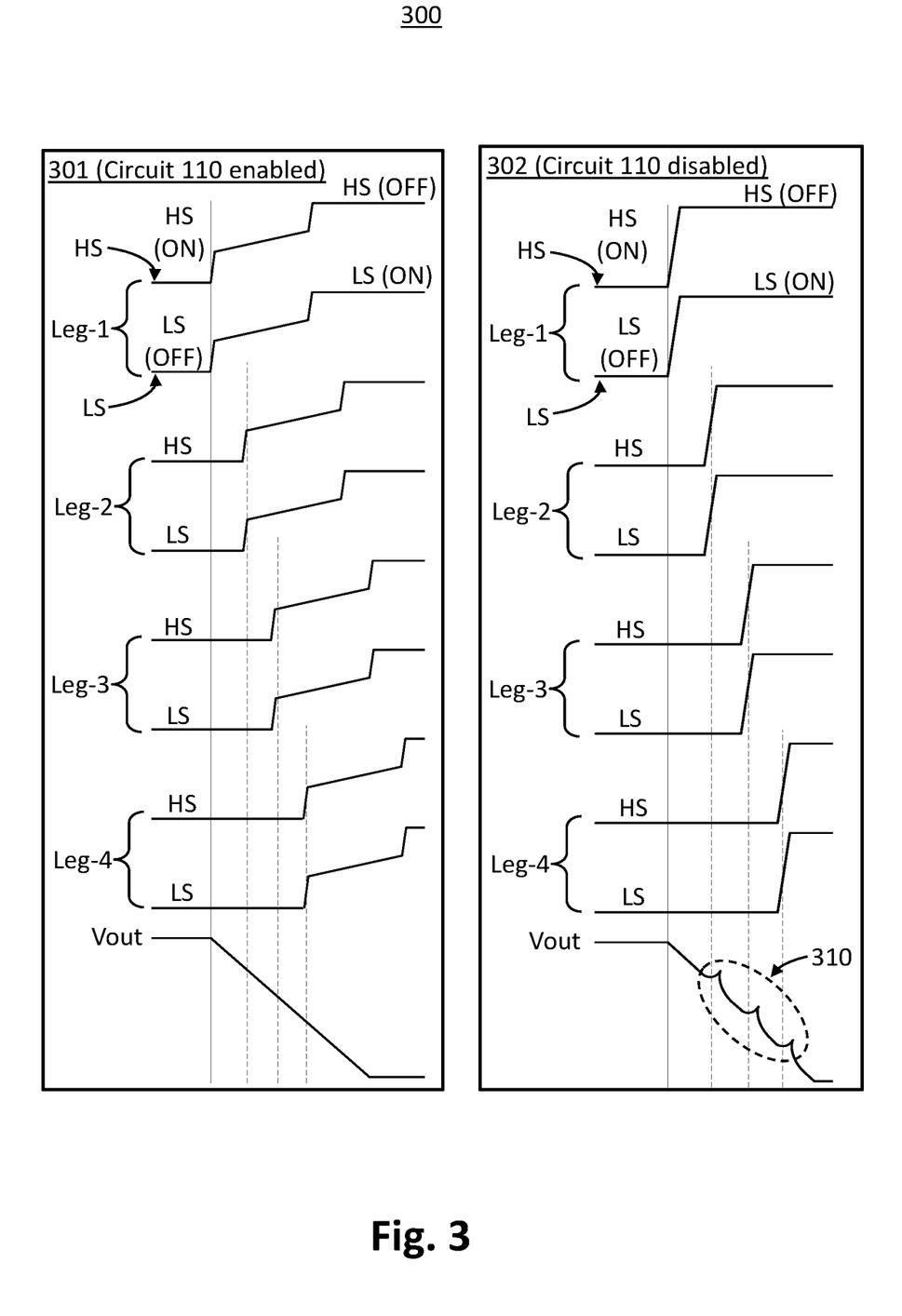
FIG. 3 is a diagram showing waveforms of multiple driver outputs resulting from an implementation of multi-region transmitter output waveform control in one embodiment.

FIG. 3 is a diagram showing an example waveform control circuit that can be used for implementing multi-region transmitter output waveform control in one embodiment. Descriptions of FIG. 3 may reference components that are also shown in FIG. 1 to FIG. 2. In an example shown in FIG. 3, four legs Leg-1 to Leg-4 among the N legs in FIG. 1 are activated to drive respective output driver stage for generating Vout. The four legs can be switched sequentially. Waveforms 301 shows a scenario where waveform control circuit ("circuit 110") are enabled in all four legs, and waveforms 301 shows a scenario where waveform control circuit ("circuit 110") are disabled in all four legs.

Comparing waveforms 301 with waveforms 302, when waveform control circuit 110 in the four legs are disabled, the crowbar current Icb that occurs during the transition of each transistor pair in each leg is significant enough to create disturbances 310, such as voltage spikes, on output voltage Vout. When waveform control circuit 110 in the four legs are enabled, the crowbar current Ich is reduced and there may be no disturbances on output voltage Vout and Vout can have a relatively smooth waveform.

Figure 4:
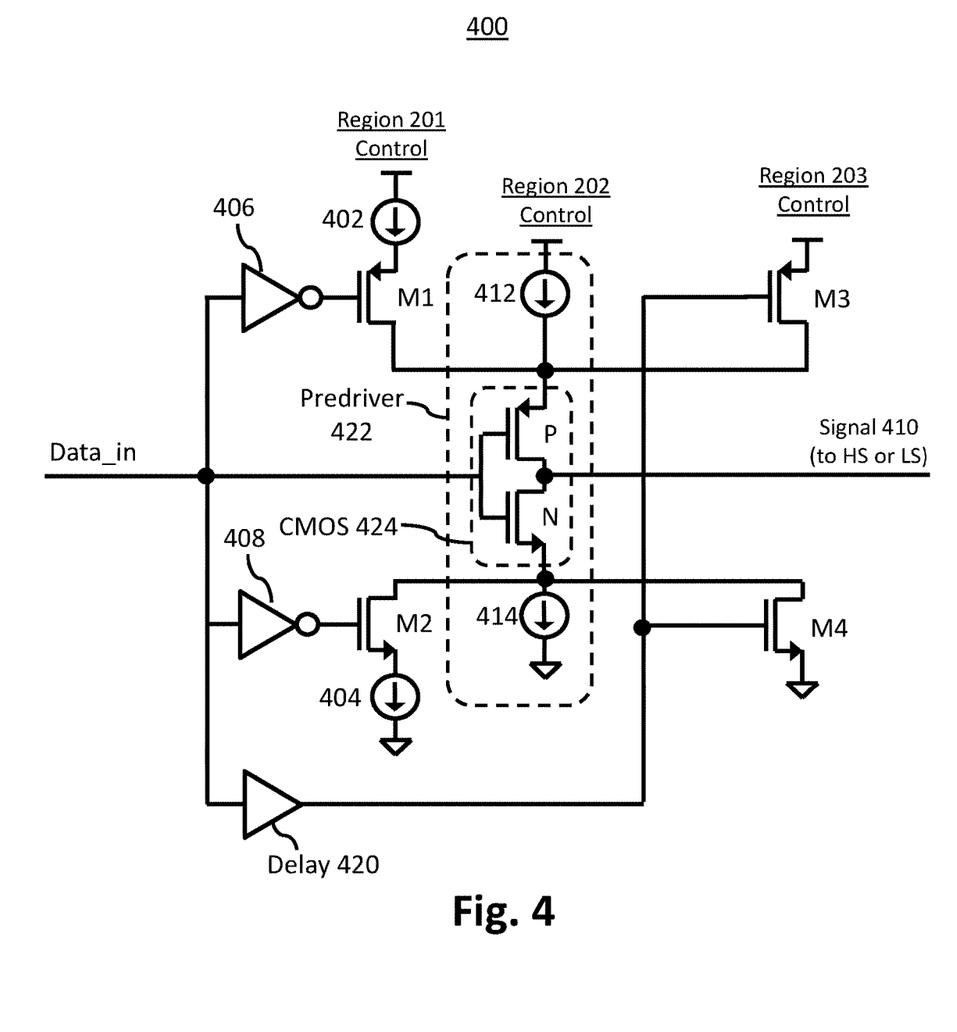
FIG. 4 is a diagram showing an example waveform control circuit that can be used for implementing multi-region transmitter output waveform control in one embodiment.

FIG. 4 is a diagram showing an example waveform control circuit that can be used for implementing multi-region transmitter output waveform control in one embodiment. Descriptions of FIG. 4 may reference components that are also shown in FIG. 1 to FIG. 3. A waveform control circuit 400 is shown in FIG. 4. Waveform control circuit 400 can be HS control circuit 112 or LS control circuit 114 shown in FIG. 1. In one embodiment, waveform control circuit 400 can include inverters 406, 408, current sources 402, 404, 412, 414, transistors M1, M2, M3, M4, and a delay block 420. In one embodiment, a predriver circuit 422 ("predriver 422") can also be part of waveform control circuit 400. Transistors M1, M2, M3, M4 can be MOSFETs. Transistors M1 and M3 can be PMOS devices or P-type MOSFETs and transistors M2 and M4 can be NMOS devices or N-type MOSFETs. Predriver 422 can include a complementary metal-oxide semiconductor (CMOS) inverter 424 ("CMOS 424") configured to gate input signal data_in to output signal 410. Current sources 402, 404, 412, 414 and delay block 420 can be digitally controlled with current digital-to-analog converters (DACs) that can be in waveform control circuit 110 (or 112, 114, 400).

If waveform control circuit 400 is being implemented for controlling HS transistor, input signal data_in can be a drive signal provided by NAND gate 104 shown in FIG. 1. If waveform control circuit 400 is being implemented for controlling LS transistor, input signal data_in can be a drive signal provided by NOR gate 106 shown in FIG. 1. Output signal 410 of waveform control circuit 400 can be a gate voltage signal (e.g., VgHS or VgLS shown in FIG. 2) for driving HS transistor or LS transistor. To drive HS transistor or LS transistor from OFF to ON, data_in can be a low voltage (e.g., voltage representing logic LOW) or 0V and output signal 410 can be high voltage (e.g., voltage representing logic HIGH). To drive HS transistor or LS transistor from ON to OFF, data_in can be a low voltage and output signal 410 can be high voltage.

To control a slew rate, or a gate voltage change rate, of signal 410 under operation region 201 (see FIG. 2), waveform control circuit 400 can control one of current sources 402, 404 depending on the value of the input signal data_in. If the device being driven (e.g., HS transistor or LS transistor) is in an OFF state, at the start of operation region 201, such as time t1 shown in FIG. 2, the PMOS device ("P") of CMOS inverter 424 can be OFF and the NMOS device ("N") of CMOS inverter 424 can be ON. In order to output signal 410 as a high voltage signal to turn on either HS transistor or LS transistor, data_in can be a low voltage signal or 0V to cause CMOS inverter 424 to turn on the PMOS device and to turn off the NMOS device.

If data_in is low voltage or 0V, inverters 406, 408 can output high voltage, transistors M1, M4 can be turned off and transistors M2, M3 can be turned on. At the start of operation region 201, such as t1 shown in FIG. 2, in response to transistor M2 being turned on and transistor M1 being turned off, waveform control circuit 400 can control current source 404 to pull additional current from the PMOS device, thus increasing a rising slew rate of signal 410. A duration of operation region 201 can be arbitrary, and can terminate (transition into operation region 202) before signal 410 reaches a threshold voltage of the transistor being driven by signal 410 (e.g., see VthHS and VthLS in FIG. 2).

Under operation region 202, if data_in is low voltage or 0V, waveform control circuit 400 can adjust current source 412 and/or current source 414 to control a rising slew rate of predriver 422. By way of example, waveform control circuit 400 can decrease the amount of current being drawn by current sources 412, 414 towards ground to reduce the rising slew rate of signal 410. Waveform control circuit 400 can control the rising slew rate of signal 410 in operation region 202 to be lower than the rising slew rate of signal 410 in operation region 201. Under operation region 202, a voltage level of signal 410 can cross threshold voltage of the transistor being driven by signal 410, as shown in FIG. 2.

Under operation region 203, in response to transistor M3 being turned on and transistor M4 being turned off, extra current can be provided from transistor M3 to the PMOS device in CMOS inverter 424 to increase the rising slew rate of signal 410 in order to complete transition of signal 410 from low voltage to high voltage. In one embodiment, delay block 420 can apply a delay to prevent transistor M3 from being turned on until a start of operation region 203, such as t3 shown in FIG. 2. The prevention of turning on transistor M3 can maintain the relatively slow rising slew rate of signal 410 in operation region 202. When operation region 202 is complete, the delay being applied by delay block 420 also expires and transistor M3 can be turned on to increase the rising slew rate of signal 410.

If the device being driven (e.g., HS transistor or LS transistor) is in an ON state, at the start of operation region 201, the PMOS device of CMOS inverter 424 can be ON and the NMOS device of CMOS inverter 424 can be OFF. In order to output signal 410 as a low voltage signal to turn off either HS transistor or LS transistor, data_in can be a high voltage signal to cause CMOS inverter 424 to turn off the PMOS device and to turn on the NMOS device.

If data_in is high voltage, inverters 406, 408 can output low voltage, transistors M2, M2 can be turned off and transistors M1, M4 can be turned on. At the start of operation region 201, in response to transistor M1 being turned on and transistor M2 being turned off, waveform control circuit 400 can control current source 402 to push additional current to the PMOS device, thus increasing a falling slew rate of signal 410. A duration of operation region 201 can be arbitrary, and can terminated (transition into operation region 202) before signal 410 reaches a threshold voltage of the transistor being driven by signal 410 (e.g., see VthHS and VthLS in FIG. 2).

Under operation region 202, if data_in is high voltage, waveform control circuit 400 can adjust current source 412 and/or current source 414 to control a falling slew rate of predriver 422. By way of example, waveform control circuit 400 can decrease the amount of current being drawn by current sources 412, 414 towards ground to reduce the falling slew rate of signal 410. Waveform control circuit 400 can control the falling slew rate of signal 410 in operation region 202 to be lower than the falling slew rate of signal 410 in operation region 201. Under operation region 202, a voltage level of signal 410 can cross threshold voltage of the transistor being driven by signal 410, as shown in FIG. 2.

Under operation region 203, in response to transistor M4 being turned on and transistor M3 being turned off, extra current can be provided from transistor M4 to the NMOS device in CMOS inverter 424 to increase the falling slew rate of signal 410 in order to complete transition of signal 410 from high voltage to low voltage. In one embodiment, delay block 420 can apply a delay to prevent transistor M4 from being turned on until a start of operation region 203, such as t3 shown in FIG. 2. The prevention of turning on transistor M4 can maintain the relatively slow rising slew rate of signal 410 in operation region 202. When operation region 202 is complete, the delay being applied by delay block 420 also expires and transistor M4 can be turned on to increase the rising slew rate of signal 410.

In one embodiment, delay block 420 can be set to an amount of delay that allows the output critical transition (e.g., transition in operation region 202) zone to expired before operation region 203 starts, such that the hard switching of CMOS inverter 424 in predriver 422 does not affect the critical transitioning portion of the waveform of signal 410. In one embodiment, the delay being applied by delay block 420 can be less than a data interval of input data 101 shown in FIG. 1 in order to prevent introduction of jitter.

In one embodiment, each leg in apparatus 100 can include two copies of waveform control circuit 400 to implement HS control circuit 112 and LS control circuit 114. HS control circuit 112 and LS control circuit 114 can drive VgHS and VgLS symmetrically or asymmetrically in operation regions 201 and 202. If HS control circuit 112 and LS control circuit 114 drive VgHS and VgLS symmetrically, current sources 402, 404, 412 and 414 in the different copies of waveform control circuit 400 can be controlled with identical amount of current under operation regions 201 and/or 202. If HS control circuit 112 and LS control circuit 114 drive VgHS and VgLS asymmetrically, current sources 402, 404, 412 and 414 in the different copies of waveform control circuit 400 can be controlled with different amounts of current under operation regions 201 and/or 202.

Further, multiple copies of waveform control circuit 400 can be instantiated in parallel such that multiple legs of apparatus 100 can be activated to drive respective output driver stage for generating Vout, as shown in FIG. 3. The gate voltage slew rate control of waveform control circuits 400 can reduce crowbar current Icb and prevent disturbance, such as voltage spikes, on the output voltage Vout generated by the multiple activated legs. Furthermore, predriver circuits 422 in different copies of waveform control circuits 400 can be sized to control any number of activated legs in apparatus 100.

Figure 5:
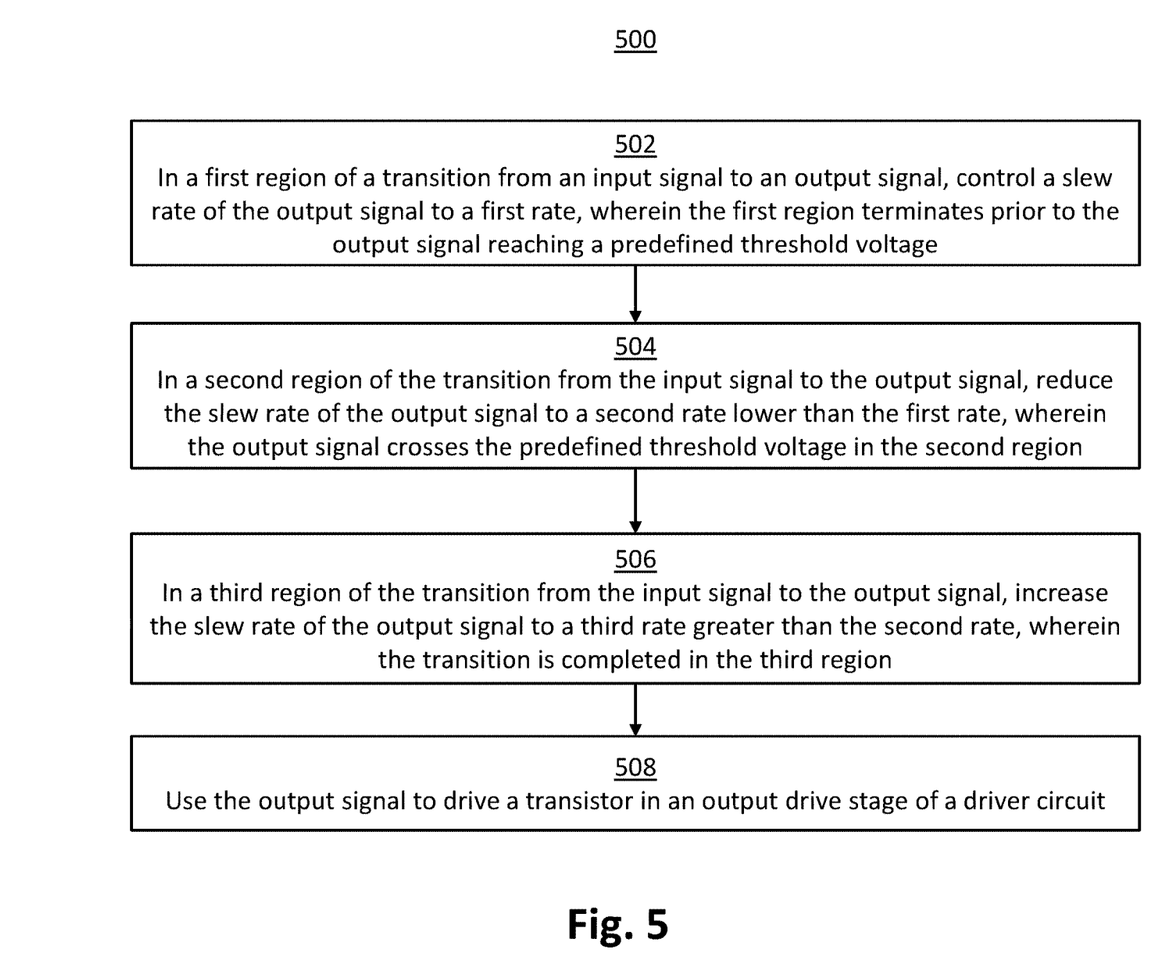
FIG. 5 is a flowchart of an example process that can implement multi-region transmitter output waveform control in one embodiment.

FIG. 5 is a flowchart of an example process that can implement skew corner driver compensation in one embodiment. A process 500 in FIG. 5 may be implemented using, for example, apparatus 100 discussed above. Process 500 can include one or more operations, actions, or functions as illustrated by one or more of blocks 502, 504, 506 and/or 508. Although illustrated as discrete blocks, various blocks may be divided into additional blocks, combined into fewer blocks, eliminated, performed in different order, or performed in parallel, depending on the desired implementation.

Process 500 can be performed by a driver circuit, such as a push-pull driver. Process 500 can begin at block 502, in a first region of a transition from an input signal to an output signal, the driver circuit can control a slew rate of the output signal to a first rate. The first region can terminate prior to the output signal reaching a predefined threshold voltage. Process 500 can proceed from block 502 to block 504. At block 504, in a second region of the transition from the input signal to the output signal, the driver circuit can reduce the slew rate of the output signal to a second rate lower than the first rate. The output signal can cross the predefined threshold voltage in the second region. Process 500 can proceed from block 504 to block 506. At block 506, in a third region of the transition from the input signal to the output signal, the driver circuit can increase the slew rate of the output signal to a third rate greater than the second rate, where the transition can be completed in the third region. Process 500 can proceed from block 506 to block 508. At block 508, the driver circuit can use the output signal to drive a transistor in an output drive stage of a driver circuit.

In one embodiment, in the first region, the driver circuit can control a first current source and a second current source to set the slew rate at the first rate. In the second region, the driver circuit can control a third current source and a fourth current source in a predriver circuit of the driver circuit to set the slew rate at the second rate. In one embodiment, in the first region, the driver circuit can apply a delay to start the third region after the second region is completed.

In one embodiment, in response to the input signal being a low voltage signal, the driver circuit can enable a first transistor to connect a current source to an N-type metal-oxide-semiconductor (NMOS) device of a complementary metal-oxide semiconductor (CMOS) inverter of a predriver in the driver circuit. The driver circuit can further control the current source to set the slew rate to the first rate. The driver circuit can further enable a second transistor connected to a P-type metal-oxide-semiconductor (PMOS) device of the CMOS inverter to increase the slew rate from the second rate to third rate at a start of the third region.

In one embodiment, in response to the input signal being a high voltage signal, the driver circuit can enable a first transistor to connect a current source to a PMOS device of a CMOS inverter of a predriver in the driver circuit. The driver circuit can further control the current source to set the slew rate to the first rate. The driver circuit can further enable a second transistor connected to an NMOS device of the CMOS inverter to increase the slew rate from the second rate to third rate at a start of the third region.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be implemented substantially concurrently, or the blocks may sometimes be implemented in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The disclosed embodiments of the present invention have been presented for purposes of illustration and description but are not intended to be exhaustive or limited to the invention in the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A semiconductor device comprising:
   a predriver circuit including a complementary metal-oxide semiconductor (CMOS) inverter configured to invert an input signal to generate an output signal; and
   a circuit configured to:
      in a first region of a transition from the input signal to the output signal, control a first current source and a second current source to set a slew rate at a first rate, wherein the first region terminates prior to the output signal reaching a predefined threshold voltage;
      in a second region of the transition from the input signal to the output signal, control a third current source and a fourth current source in the predriver circuit to set the slew rate at a second rate lower than the first rate, wherein the output signal crosses the predefined threshold voltage in the second region;
      in a third region of the transition from the input signal to the output signal, increase the slew rate of the output signal to a third rate greater than the second rate, wherein the transition is completed in the third region; and
      output the output signal to drive a transistor in an output drive stage of a driver circuit.

2. The semiconductor device of claim 1, wherein the circuit is configured to control the first, second, third and fourth current sources using digital-to-analog converters (DACs).

3. The semiconductor device of claim 1, wherein the circuit is configured to, in the first region, apply a delay to start the third region after the second region is completed.

4. The semiconductor device of claim 1, wherein the circuit is configured to, in response to the input signal being a low voltage signal:
   enable a first transistor to connect a current source to an N-type metal-oxide-semiconductor (NMOS) device of the CMOS inverter;
   control the current source to set the slew rate to the first rate; and
   enable a second transistor connected to a P-type metal-oxide-semiconductor (PMOS) device of the CMOS inverter to increase the slew rate from the second rate to third rate at a start of the third region.

5. The semiconductor device of claim 1, wherein the circuit is configured to, in response to the input signal being a high voltage signal:
   enable a first transistor to connect a current source to a PMOS device of the CMOS inverter;
   control the current source to set the slew rate to the first rate; and enable a second transistor connected to an NMOS device of the CMOS inverter to increase the slew rate from the second rate to third rate at a start of the third region.

6. An apparatus comprising:
a controller configured to provide an input signal;
an output driver stage comprising a high-side transistor and a low-side transistor, the output driver stage being configured to use a pair of drive signals to drive the high-side transistor and the low-side transistor; and
a circuit configured to:
  increase slew rates of the drive signals in a first region of a transition from the input signal to the pair of drive signals, wherein the first region is terminated prior to the pair of drive signals reaching threshold voltages of the high-side transistor and low-side transistor;
  reduce the slew rates of the pair of drive signals in a second region of the transition from the input signal to the pair of drive signals, wherein the pair of drive signals crosses the threshold voltages of the high-side transistor and the low-side transistor in the second region; and
  increase the slew rates of the pair of drive signals in a third region of the transition from the input signal to the pair of drive signals, wherein the transition from the input signal to the pair of drive signals are completed in the third region,
wherein a crowbar current in the output driver stage is dependent on the different slew rates in the different regions of the transition.

7. The apparatus of claim 6, wherein the circuit is configured to control the slew rates of the pair of drive signals symmetrically.

8. The apparatus of claim 6, wherein the circuit is configured to control the slew rates of the pair of drive signals asymmetrically.

9. The apparatus of claim 6, wherein the circuit is configured to control at least one current source to set the slew rates of the pair of drive signals to the different slew rates in the different regions of the transition.

10. The apparatus of claim 9, wherein the circuit is configured to control the at least one current source using digital-to-analog converters (DACs).

11. The apparatus of claim 6, wherein the circuit comprises:
  a first portion configured to control a slew rate of a first drive signal among the pair of drive signals being used to drive the high-side transistor; and
  a second portion configured to control a slew rate of a second drive signal among the pair of drive signals being used to drive the low-side transistor.

12. The apparatus of claim 6, wherein the circuit is configured to, in the first region of the transition from the input signal to the pair of drive signals, apply a delay to start the third region after the second region of the transition is completed.

13. The apparatus of claim 6, wherein the controller, the output driver stage and the circuit are parts of a push-pull driver.

14. A method for operating a driver circuit, the method comprising:
  in a first region of a transition from an input signal to an output signal, controlling a first current source and a second current source to set a slew rate at a first rate, wherein the first region terminates prior to the output signal reaching a predefined threshold voltage;
  in a second region of the transition from the input signal to the output signal, controlling a third current source and a fourth current source in a predriver circuit of the driver circuit to set the slew rate at a second rate lower than the first rate, wherein the output signal crosses the predefined threshold voltage in the second region;
  in a third region of the transition from the input signal to the output signal, increasing the slew rate of the output signal to a third rate greater than the second rate, wherein the transition is completed in the third region; and
  using the output signal to drive a transistor in an output drive stage of a driver circuit.

15. The method of claim 14, further comprising, in the first region, applying a delay to start the third region after the second region is completed.

16. The method of claim 14, further comprising, in response to the input signal being a low voltage signal:
  enabling a first transistor to connect a current source to an N-type metal-oxide-semiconductor (NMOS) device of a complementary metal-oxide semiconductor (CMOS) inverter of a predriver in the driver circuit;
  controlling the current source to set the slew rate to the first rate; and
  enabling a second transistor connected to a P-type metal-oxide-semiconductor (PMOS) device of the CMOS inverter to increase the slew rate from the second rate to third rate at a start of the third region.

17. The method of claim 14, further comprising, in response to the input signal being a high voltage signal:
  enabling a first transistor to connect a current source to a PMOS device of a CMOS inverter of a predriver in the driver circuit;
  controlling the current source to set the slew rate to the first rate; and
  enabling a second transistor connected to an NMOS device of the CMOS inverter to increase the slew rate from the second rate to third rate at a start of the third region.

* * * * *